(12) United States Patent
Morikawa

(10) Patent No.: US 7,844,102 B2
(45) Date of Patent: Nov. 30, 2010

(54) ANALOG-TO-DIGITAL CONVERSION APPARATUS AND SENSING APPARATUS HAVING THE SAME

(75) Inventor: Kenji Morikawa, Hekinan (JP)

(73) Assignee: Denso Corporation, Kariya (JP)

( * ) Notice: Subject to any disclaimer, the term of this patent is extended or adjusted under 35 U.S.C. 154(b) by 1287 days.

(21) Appl. No.: 11/386,765

(22) Filed: Mar. 23, 2006

(65) Prior Publication Data

US 2006/0232456 A1 Oct. 19, 2006

(30) Foreign Application Priority Data

Mar. 30, 2005 (JP) .............................. 2005-99326

(51) Int. Cl.
  *G06K 9/00* (2006.01)
  *H03M 1/00* (2006.01)
  *H03M 1/12* (2006.01)
(52) U.S. Cl. .................. 382/149; 341/126; 341/155
(58) Field of Classification Search ................. 382/100, 382/149, 312; 341/110, 116, 126, 128, 129, 341/155, 156, 158; 706/34; 710/69
See application file for complete search history.

(56) References Cited

U.S. PATENT DOCUMENTS

| | | | |
|---|---|---|---|
| 5,396,247 A | | 3/1995 | Watanabe et al. |
| 5,995,033 A | * | 11/1999 | Roeckner et al. ............ 341/155 |
| 6,188,346 B1 | * | 2/2001 | Waho et al. ................. 341/156 |
| 6,255,976 B1 | | 7/2001 | Watanabe et al. |
| 6,307,496 B1 | | 10/2001 | Ikuta et al. |
| 6,329,825 B1 | * | 12/2001 | Tanaka et al. ............... 324/725 |
| 6,509,861 B2 | | 1/2003 | Watanabe |

FOREIGN PATENT DOCUMENTS

| | | |
|---|---|---|
| JP | 2001-053608 | 2/2001 |
| JP | 2005-005913 | 1/2005 |

OTHER PUBLICATIONS

Japanese Office Action dated Jan. 29, 2010, issued in corresponding Japanese Application No. 2005-099326, with English translation.

\* cited by examiner

*Primary Examiner*—Abolfazl Tabatabai
(74) *Attorney, Agent, or Firm*—Nixon & Vanderhye PC

(57) ABSTRACT

A sensing apparatus includes a reference voltage generation circuit for generating a first and a second reference signals having different constant voltage levels, an A/D conversion circuit having a ring-gate-delay circuit, and a correction circuit for correcting an output value of the A/D conversion circuit. The A/D conversion circuit converts a load signal and the first and second reference signals to digital data based on the number of times a pulse signal input to the ring-gate-delay circuit circulates through the ring-gate-delay circuit. The correction circuit corrects the output value based on a ratio of a first difference between the digital data to a second difference between the digital data.

7 Claims, 3 Drawing Sheets

ANALOG-TO-DIGITAL CONVERSION APPARATUS AND SENSING APPARATUS HAVING THE SAME

CROSS REFERENCE TO RELATED APPLICATION

This application is based on and incorporates herein by reference Japanese Patent Application No. 2005-99326 filed on Mar. 30, 2005.

FIELD OF THE INVENTION

The present invention relates to an analog-to-digital conversion circuit and sensing apparatus having the same.

BACKGROUND OF THE INVENTION

A physical quantity such as load or pressure detected by a sensing circuit is converted to a detection signal. In resent years, the detection signal representing the physical quantity is generally converted to digital data by an analog-to-digital (A/D) conversion circuit and the digital data is input to a microcomputer. The microcomputer performs a computation such as temperature compensation so that a detection value corresponding to the physical quantity can be obtained. The sensing apparatus has a temperature sensing circuit for generating a temperature signal having a voltage level corresponding to a temperature of the sensing circuit. The microcomputer performs the temperature compensation based on the temperature signal.

In a well-known A/D conversion circuit, a voltage signal to be converted is compared with a reference voltage by an analog comparator and converted into binary numbers. However, in such an A/D conversion circuit, it is difficult to significantly improve the conversion speed and to allow the binary numbers to reflect a slight change in the voltage signal. Accordingly, the A/D conversion circuit takes a long time to calculate the detection value and accuracy of the calculated detection value is reduced.

An A/D conversion circuit of a sensing apparatus disclosed in U.S. Pat. No. 6,307,496 corresponding to JP-A-H11-44585 overcomes the above problem. The A/D conversion circuit includes a ring-gate-delay circuit (RGD) having multiple inverting circuits connected in a ring pattern. Each inverting circuit performs an inverting operation at a variable speed that depends on a power voltage of the RGD. In the A/D conversion circuit, while a voltage signal to be converted to digital data is applied to the RGD as the power voltage of the RGD, a pulse signal is input to the RGD. The voltage signal is converted to digital data based on the number of times the pulse signal circulates through the RGD. In the A/D conversion circuit, the conversion speed and resolution can be significantly improved.

However, the inverting operation speed of the inverting circuits depends on not only the power voltage of the RGD but also a temperature of the RGD. Therefore, the A/D conversion circuit may produce an output value including a nonlinear factor due to the temperature dependence on the RGD. Consequently, accuracy of the output value may be reduced.

The A/D conversion circuit includes a reference voltage generation circuit for generating a reference signal having a voltage level that remains constant regardless of load (physical quantity) applied to the sensing circuit and temperature of the sensing circuit. The A/D conversion circuit converts the reference signal to a reference data. By using the reference data, the nonlinear factor due to the temperature dependence on the RGD can be eliminated.

In practice, however, there are offsets between the detection signal, the temperature signal, and the reference signal due to differences in electrical characteristics between the sensing circuit, the temperature sensing circuit, and the reference voltage generation circuit. The A/D conversion circuit includes a memory for storing voltage correction data corresponding to the offsets. When being applied to the RGD as the power voltage, the detection signal, the temperature signal, and the reference signal are corrected by the voltage correction data, respectively. Therefore, the digital data converted by the A/D conversion circuit includes no error factor due to the offsets. In the sensing apparatus disclosed in U.S. Pat. No. 6,307,496, therefore, the accuracy of the output value corresponding to the physical quantity can be improved.

In the sensing apparatus, temperature dependences (offset and gain) of the detection value on both the sensing circuit and the A/D conversion circuit are corrected. Accordingly, an equation for calculating the output value includes a correction factor determined by the temperature dependences. In order to determine the correction factor, the sensing apparatus should be tested at two or more temperatures (e.g. −40° C. and 120° C.) at a point where the sensing apparatus indicates zero and at a point where the sensing apparatus indicates a maximum value.

In the calibration test for correcting for the temperature dependences, a desired load needs to be applied to the sensing apparatus at high and low temperatures. Therefore, costly large-scale equipment is required for the calibration test to be performed.

Further, the sensing apparatus disclosed in U.S. Pat. No. 6,307,496 needs a temperature sensing circuit, and accordingly manufacturing cost of the sensing apparatus may be increased.

In the sensing apparatus, the correction factor included in the equation for calculating the detection value depends on not only the sensing circuit but also the A/D conversion circuit. Therefore, whenever the A/D conversion circuit is used, the calibration test is required.

SUMMARY OF THE INVENTION

In view of the above-described problem, it is an object of the present invention to provide an analog-to-digital conversion apparatus in which an accurate value having no temperature dependence can be obtained without a temperature sensing circuit and a calibration test for correcting for a temperature dependence, and a sensing apparatus having the same.

An analog-to-digital (A/D) conversion apparatus includes a reference voltage generation circuit for generating a first reference signal having a first constant voltage level and a second reference signal having a second constant voltage level different from the first constant voltage level, an A/D conversion circuit including a ring-gate-delay circuit having a plurality of inverting circuits that performs an inverting operation at a variable speed depending on a power voltage of the ring-gate-delay circuit and are connected in a ring pattern, the A/D conversion circuit converting a physical quantity signal having a voltage level varying with an amount of a physical quantity, the first reference signal, and the second reference signal, each signal being provided to the ring-gate-delay circuit as the power voltage, to a physical quantity data, a first reference data, and a second reference data, respectively, based on the number of times a pulse signal input to the ring-gate-delay circuit circulates through the ring-gate-delay circuit, and a signal processing means for calculating an output value corresponding to the physical quantity based on a ratio between a first deference and a second difference. The first difference is a difference between any single pair from the physical quantity data, the first reference data, and the second reference data. The second difference is a difference between one of the other pairs from the physical quantity data, the first reference data, and the second reference data.

The A/D conversion circuit has gain and an offset that vary with temperature. The first and second differences include no variation due to variation in the offset, because the physical quantity data, the first reference data, and the second reference data includes the same variations due to the variation in the offset. Therefore, the ratio between the first and the second differences includes no variation due to the variations in the gain and offset. In the A/D conversion apparatus, thus, an accurate output value having no temperature dependence can be obtained without a temperature sensing circuit and a calibration test for correcting for the temperature dependence.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

A semiconductor-type load sensing apparatus of an embodiment will now be described with reference to FIG. 1. For example, the sensing apparatus may be built into a rod of a shock absorber of a vehicle to measure a damping force in order to detect irregularities of a road surface.

Figure 1:
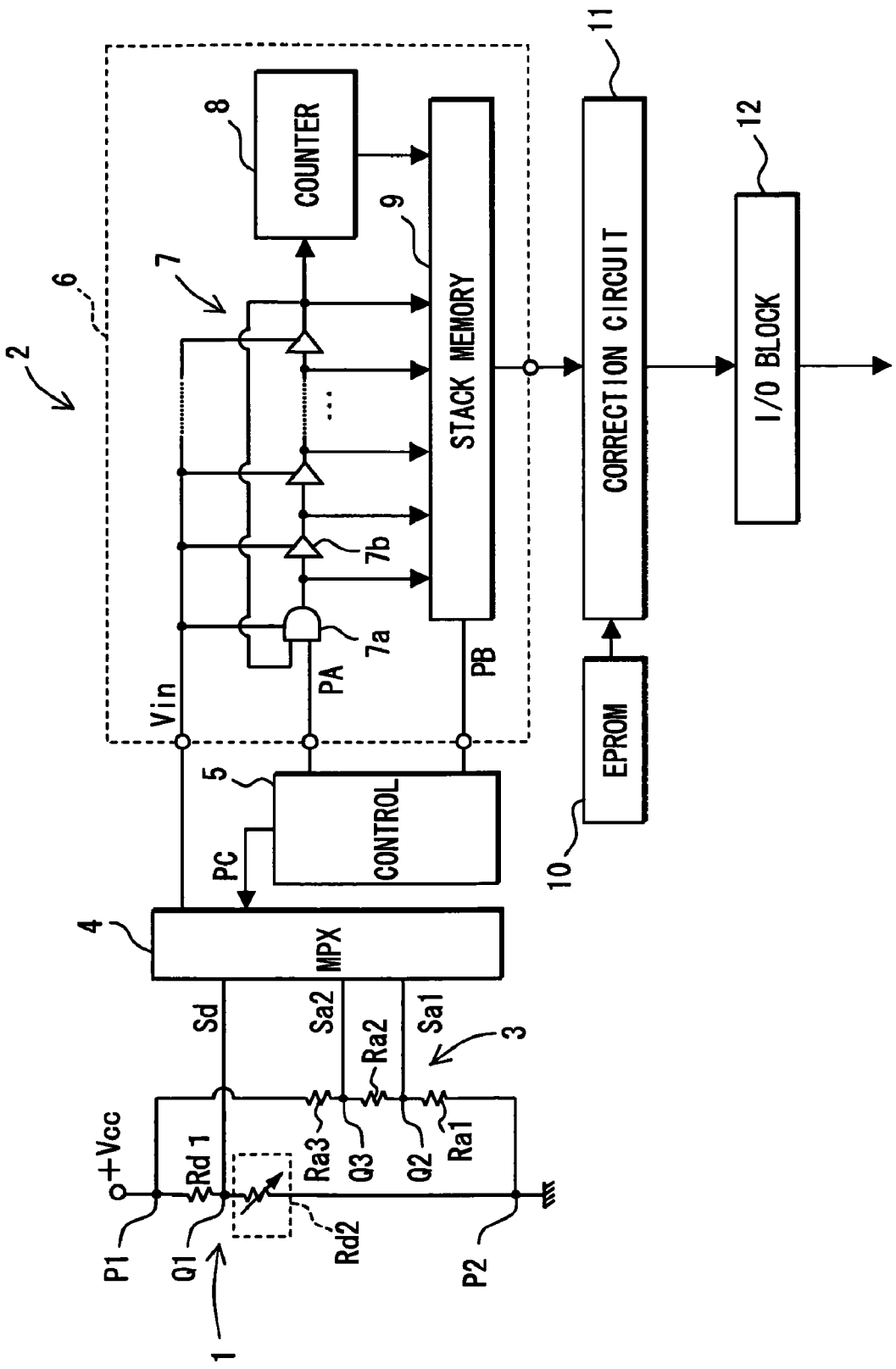
FIG. 1 is a circuit diagram of a sensing apparatus according to an embodiment of the present invention.

As shown in FIG. 1, the sensing apparatus includes a load sensing bridge circuit 1 as the sensing circuit and a signal processing section 2 for processing an output signal from the load sensing bridge circuit 1. The load sensing bridge circuit 1 and the signal processing section 2 are separately disposed on different semiconductor chips.

The load sensing bridge circuit 1 is disposed on a semiconductor chip (e.g., silicon single crystal substrate) having a large piezoresistive coefficient. Diffused resistors Rd1, Rd2 are disposed on a diaphragm mounted on the semiconductor chip and connected in a half-bridge configuration as shown in FIG. 1. The diffused resistor Rd1 is made of, for example, chromium silicide (CrSi) that has a temperature coefficient close to zero. The diffused resistor Rd2 has a resistance that decreases with an increase in applied load (i.e., physical quantity). A predetermined constant voltage is applied between input terminals P1, P2 of the load sensing bridge circuit 1 by a constant power supply +Vcc. Thus, a load signal Sd having a voltage level corresponding to the applied load is output from an output terminal Q1 of the load sensing bridge circuit 1.

The signal processing section 2, disposed on another chip, includes a reference voltage generation circuit 3, an analog multiplexer (MPX) 4, a control circuit 5, an A/D conversion circuit 6, an erasable programmable read-only memory (EPROM) 10 as the storing means, a correction circuit 11 as the signal processing means, and an input/output (I/O) block 12.

The reference voltage generation circuit 3 includes diffused resistors Ra1-Ra3 connected in series in that order. The series circuit of the diffused resistors Ra1-Ra3 is connected between ground and a positive terminal of the constant power supply +Vcc in such a manner that the diffused resistor Ra1 is connected to the ground. A first reference signal Sa1 is output from an output terminal Q2 between the diffused resistors Ra1, Ra2, and a second reference signal Sa2 is output from an output terminal Q3 between the diffused resistors Ra2, Ra3. Thus, the first and the second reference signals Sa1, Sa2 have predetermined voltage levels, respectively, that remain constant regardless of the load applied to the load sensing bridge circuit 1. In this case, the voltage level of the second reference signal Sa2 is set higher than that of the first reference signal Sa1. The diffused resistors Ra1-Ra3 have the same temperature coefficients. Therefore, the voltage levels of the first and the second reference signals Sa1, Sa2 remain constant regardless of not only the load applied to the load sensing bridge circuit 1 but also temperature of the load sensing bridge circuit 1.

The analog MPX 4 repeatedly outputs the load signal Sd, the first reference signal Sa1, and the second reference signal Sa2 in a predetermined order based on a select signal PC provided from the control circuit 5.

The A/D conversion circuit 6 has a structure similar to that of an A/D conversion circuit disclosed in U.S. Pat. No. 5,396, 247 corresponding to JP-A-H5-259907. The A/D conversion circuit 6 includes a ring-gate delay circuit (RGD) 7, a pulse counter 8, and a stack memory 9. The RGD 7 has a NAND gate 7a and even numbers of inverters 7b connected in a ring pattern as shown in FIG. 1. The pulse counter 8 counts the number of times a pulse signal has circulated through the RGD 7. The stack memory 9 stores the counted number and output values of each inverter 7b. In the stack memory 9, the counted number and the output values of the inverters 7b are set in high order bits and in low order bits, respectively.

Figure 2:
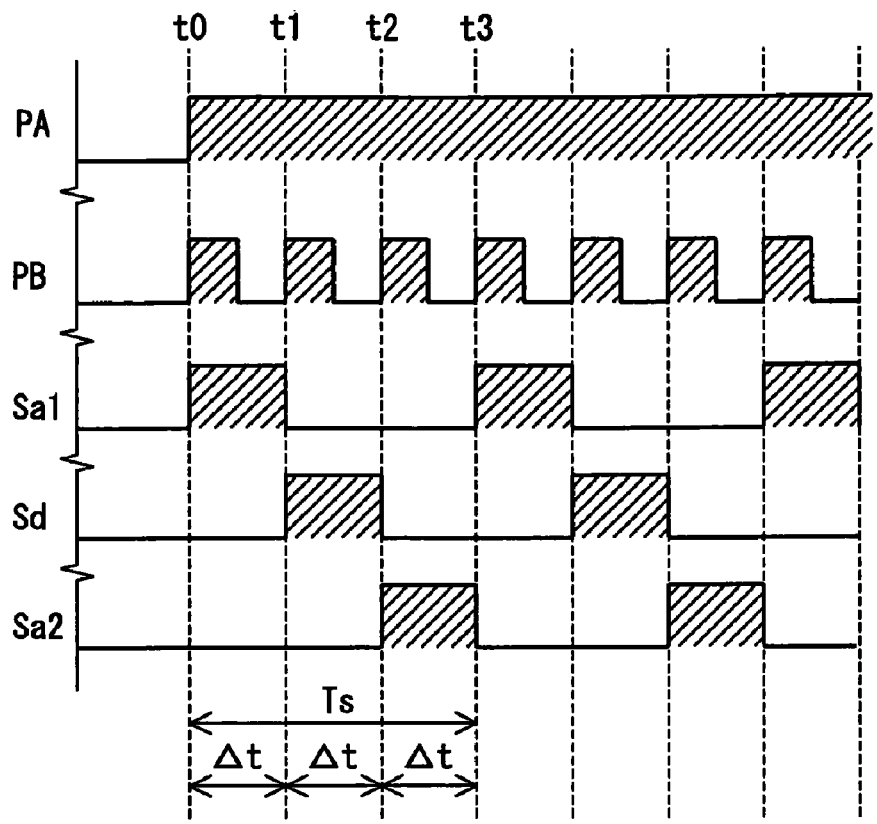
FIG. 2 is a timing diagram of a control circuit of FIG. 1.

The A/D conversion circuit 6 operates in the following manner. When a start signal PA shown in FIG. 2 is applied to the NAND gate 7a, the NAND gate 7a and each inverter 7b start an inverting operation successively. A speed of the inverting operation depends on a power voltage Vin. The pulse signal continuously circulates through the RGD 7 as long as the start signal PA is input to the NAND gate 7a. The stack memory 12 receives real-time binary digital data representing the number of times the pulse signal has circulated through the RGD 7, i.e., the number of the pulse signals counted by the pulse counter 8.

As shown in FIG. 2, a clock signal PB provides a predetermined sampling period Δt (e.g., equal to or less than 100 microseconds). The stack memory 9 is latched at each rising edge of the clock signal PB. Based on differences between latched data, A/D conversion circuit 7 converts the power voltage Vin applied to each inverter 7b to binary digital data.

The load signal Sd, the first reference signal Sa1, and the second reference signal Sa2 are successively provided as the power voltage Vin to the A/D conversion circuit 6. The A/D conversion circuit 6 successively converts the load signal Sd, the first reference signal Sa1, and the second reference signal Sa2 to a load data Dd, a first reference data Da1, and a second reference data Da2, respectively.

Figure 3:
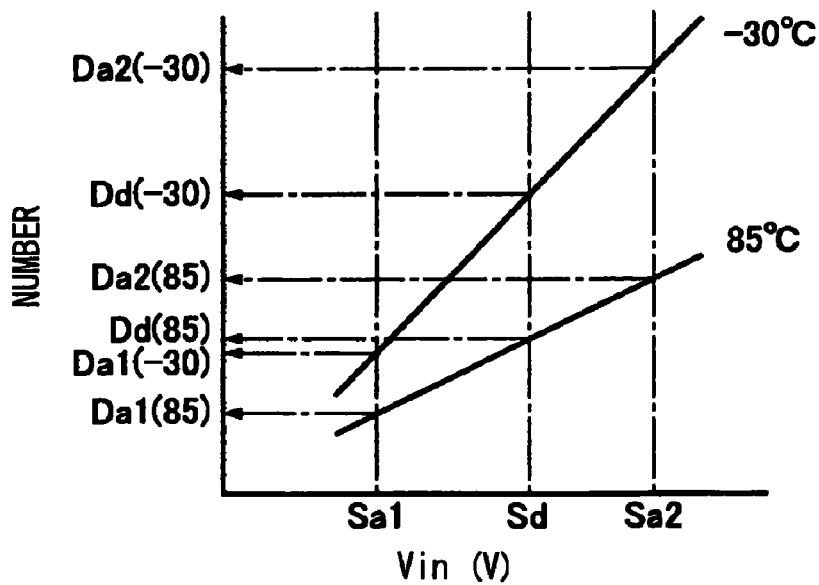
FIG. 3 is a graph illustrating a relationship between the number of pulse signals counted by a counter and a power voltage of a ring-gate-delay circuit of FIG. 1.
Figure 4:
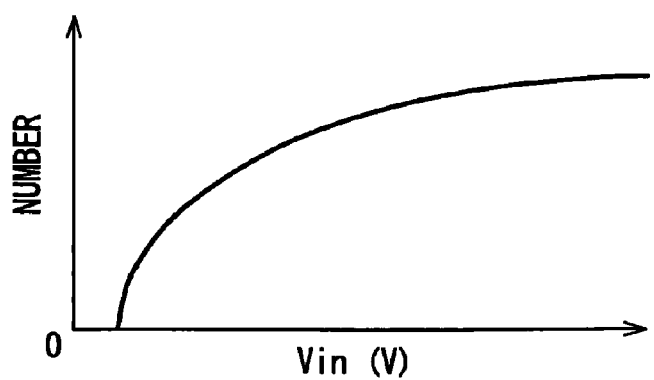
FIG. 4 is a characteristic curve illustrating a relationship between the number of pulse signals counted by a counter and a power voltage of a ring-gate-delay circuit of FIG. 1.

In the A/D conversion circuit 6, the inverting operation speed of the inverters 7b changes with not only the power voltage Vin but also temperature of the RGD 7. FIG. 3 shows a relationship between the power voltage Vin and the number of the pulse signals counted by the pulse counter 8. As shown in FIG. 3, the relationship at a predetermined temperature (e.g., −30° C., 85° C.) is approximated by a straight line. In fact, the relationship is shown by a characteristic curve illustrated in FIG. 4. In the embodiment, by adjusting resistances of the diffused resistors Rd1, Rd2, straight-line portion of the characteristic curve is used. Further, by adjusting resistances of the diffused resistors Ra1-Ra3, the first reference signal Sa1 and the second reference signal Sa2 are set near the lower limit and the upper limit of variation range of the load signal Sd, respectively.

As shown in FIG. 3, the relationship changes in gain (inclination) α and an offset (intercept) β, when the temperature of the RGD 7 changes. Therefore, if the load data Dd is used as an output value corresponding to the applied load, a lack of accuracy of the output value may be caused.

As described above, the relationship between the power voltage Vin and the number of the pulse signals at the predetermined temperature is approximated by the straight line. The straight line is represented by:

$$D = \alpha S + \beta \quad (1)$$

In the equation (1), S represents the power voltage Vin. D represents data converted by the A/D conversion circuit 6 when the power voltage Vin is S. Therefore, D corresponds to the number of the pulse signals counted by the counter 8 at the time when the power voltage Vin is S.

The offset β can be eliminated by taking a difference between the load data Dd and the first reference data Da1, between the load data Dd and the second reference data Da2, or between the first and second reference data Da1, Da2.

For example, a first difference ΔD1 between the first reference data Da1 and the second reference data Da2 is given by:

$$\Delta D1 = Da2 - Da1 = \alpha(Sa2 - Sa1) \quad (2)$$

Likewise, a second difference ΔD2 between the load data Dd and the first reference data Da1 is given by:

$$\Delta D2 = Dd - Da1 = \alpha(Sd - Sa1) \quad (3)$$

A ratio R of the first difference ΔD1 to the second difference ΔD2 is given by:

$$R = \frac{\Delta D2}{\Delta D1} = \frac{Sd - Sa1}{Sa2 - Sa1} \quad (4)$$

Thus, the gain α is also eliminated so that the ratio R has no dependence on the temperature of the RGD 7. By using the ratio R, it is possible to obtain the output value having no temperature dependence without the temperature sensing circuit and the calibration test. Therefore, if the load signal Sd output from the load sensing bridge circuit 1 has no change or negligible small change with temperature of the load sensing bridge circuit 1, the ratio R can be used as the output value without correction. However, if the load signal Sd has dependence on the temperature of the load sensing bridge circuit 1, it is preferable that the ratio R should be corrected based on the temperature of the load sensing bridge circuit 1. In this case, a means for detecting or estimating the temperature of the load sensing bridge circuit 1 is required.

As described above, the inverting operation time of the inverters 7b changes with not only the power voltage Vin but also the temperature of the RGD 7. The first and the second reference signals Sa1, Sa2 have the predetermined voltage levels that remains constant regardless of the temperature of the load sensing bridge circuit 1. Therefore, values of the first and second reference data Da1, Da2 correspond to the temperature of the RGD 7. For example, as shown in FIG. 3, the second reference data Da2 has a value of Da2 (85) at 85° C. and a value of Da2 (−30) at −30° C. Thus, estimation or detection of the temperature of the load sensing bridge circuit 1 can be archived without the temperature sensing circuit.

Figure 5:
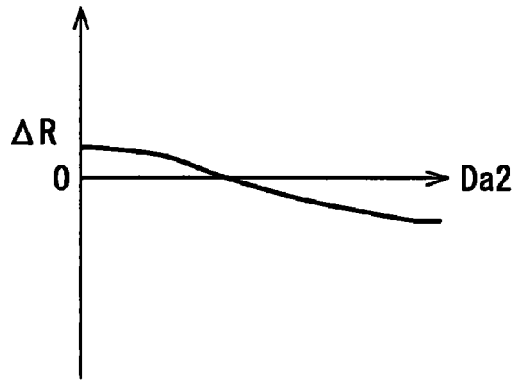
FIG. 5 is a correction map showing a relationship between a correction value and reference data.

FIG. 5 is a correction map for defining a relationship between the second reference data Da2 and a correction value ΔR. The correction map is prestored in the EPROM 10 as the storing means. The correction map can be obtained in such a manner that the ratio R is sequentially calculated while temperature of the sensing apparatus is changed within a range of operation temperature of the sensing apparatus under no load applied to the load sensing bridge circuit 1. The process for obtaining the correction map can be performed easily compared to the calibration test that the sensing apparatus disclosed in U.S. Pat. No. 6,307,496 requires.

In the correction map, the correction value ΔR represents variation in the ratio R. The variation in the ratio R results from the temperature dependence of the rate R on the load sensing circuit 1, because the second reference data Da2 changes with the temperature of the A/D conversion circuit 6 and the ratio R has no dependence on the temperature of the A/D conversion circuit 6. In practice, there is an offset due to variation in resistance of the load sensing circuit 1 and the reference voltage generation circuit 3. In the correction map, the correction value ΔR includes the offset value so that the offset can be eliminated by using the correction map.

The correction value ΔR can be calculated from the second reference data Da2 output from the A/D conversion circuit 6 by using the correction map shown in FIG. 5. Then, a corrected output value Rr can be calculated by adding the correction value ΔR to the ratio R. The corrected output value Rr has a value corrected for the dependence on the temperature of the load sensing bridge circuit 1.

Thus, the correction circuit 11 calculates the ratio R and the correction value ΔR based on the load data Dd, the first reference data Da1, the second reference data Da2 output from the A/D conversion circuit 6, and the correction map prestored in the EPROM 10. Then, the correction circuit 11 calculates the corrected output value Rr from the ratio R and the correction value ΔR. The correction output value Rr is output from an input/output (I/O) block 12.

The control circuit 5 outputs the start signal PA, the clock signal PB, and the select signal PC to the RGD 7, the stack memory 9, and the analog MPX 4, respectively. The select signal PC includes, a first select signal for selecting the first reference signal Sa1, a second select signal for selecting the second reference signal Sa2, and a load select signal for selecting the load signal Sd.

FIG. 2 is a timing diagram of the control circuit 5. The analog MPX 4 selects and outputs the load signal Sd, the first reference signal Sa1, and the second reference signal Sa2 to the RGD 7 in the predetermined order synchronously with the start signal PA and the clock signal PB. Thus, the pulse signal continuously circulates through the RGD 7 as long as the start signal PA is input to the NAND-gate 7a. The stack memory 9 is latched at the rising edge of the clock signal PB. The A/D conversion circuit 6 outputs digital data corresponding to an input signal from the analog MPX 4 to the RGD 7 based on a difference between the latched data, e.g., difference between data latched at the first rising (t0) and at the second rising edge (t1) of the clock signal PB.

In FIG. 2, the control circuit 5 outputs the first select signal as the select signal PC to the analog MPX 4 synchronously with the first rising edge (t0) of the clock signal PB. In response to the select signal PC, the first reference signal Sa1 is input from the analog MPX 4 to the RGD 7 between the first rising edge (t0) and the second rising edge (t1) of the clock signal PB. Thus, the first reference data Da1 corresponding to the first reference signal Sa1 is obtained by the A/D conversion circuit 6.

Then, the control circuit 5 outputs the load select signal as the select signal PC to the analog MPX 4 synchronously with the second rising edge (t1) of the clock signal PB. In response to the select signal PC, the load signal Sd is input from the analog MPX 4 to the RGD 7. The stack memory 9 is latched at the third rising edge (t2) of the clock signal PB. Thus, the load data Dd corresponding to the load signal Sd is obtained by the A/D conversion circuit 6.

Then, the control circuit 5 outputs the second select signal as the select signal PC to the analog MPX 4 synchronously with the third rising edge (t2) of the clock signal PB. In response to the select signal PC, the second reference signal Sa2 is input from the analog MPX 4 to the RGD 7. The stack memory 9 is latched at the fourth rising edge (t3) of the clock signal PB. Thus, the second reference data Da2 corresponding to the second reference signal Sa2 is obtained by the A/D conversion circuit 6.

In such a continuous operation, the first reference data Da1, the load data Dd, and the second reference data Da2 are successively obtained in that order at each rising edge of the clock signal PB.

When one each of the first reference data Da1, the load data Dd, and the second reference data Da2 is obtained, a calculation command signal is output to the correction circuit 11.

In response to the calculation command signal, the correction circuit 11 calculates the first difference $\Delta D1$ and the second difference $\Delta D2$ from the first reference data Da1, the second reference data Da2, and the load data Dd by using the equations (2), (3). Then, while calculating the rate R from the first difference $\Delta D1$ and the second difference $\Delta D2$ by using the equation (4), the correction circuit 11 calculates the correction value $\Delta R$ from the second reference data Da2 by using the correction map read from the EPROM 10. Then, the correction circuit 11 adds the correction value $\Delta R$ to the ratio R, thereby calculating the corrected value Rr. The corrected value Rr is output from the I/O block 12. By performing this calculation within a sampling time Ts (i.e., within three clock signals PB), the calculation result can be output successively.

In the correction circuit 11, the first difference $\Delta D1$ is calculated as the difference between the first reference data Da1 and the second reference data Da2, and the second difference $\Delta D2$ is calculated as the difference between the second reference data Da2 and the load data Dd. The first reference data Da1, the second reference data Da2, and the load data Dd include the same offset due to the temperature of the A/D conversion circuit 6. Therefore, the first difference $\Delta D1$ and the second difference $\Delta D2$ have no offset due to the temperature of the A/D conversion circuit 6. The ratio R is calculated as the ratio between the first difference $\Delta D1$ and the second difference $\Delta D2$. Therefore, the ratio R has no offset and gain variation due to the temperature of the A/D conversion circuit 6.

Thus, by using the ratio R, it is possible to obtain the output value having no dependence on the temperature of the A/D conversion circuit 6 without the temperature sensing circuit and the calibration test.

The digital data output from the A/D conversion circuit 6 changes with not only the power voltage Vin, i.e., voltage level of the input signal from the analog MPX 4 to the A/D conversion circuit 6 but also the temperature of the A/D conversion circuit 6. The second reference data Da2 to which the AND conversion circuit 6 converts the second reference signal Sa2 corresponds to the temperature of the A/D conversion circuit 6, because the second reference signal Sa2 has constant voltage level. The correction circuit 11 calculates the correction value $\Delta R$ from the second reference data Da2 by using the correction map prestored in the EPROM 10. Then, the correction circuit 11 adds the correction value $\Delta R$ to the ratio R, thereby calculating the corrected value Rr. By using the corrected value Rr, the accuracy of the output value from the correction circuit 11 can be improved The load sensing bridge circuit 1 and the reference voltage generation circuit 3 share the constant power supply +Vcc. Therefore, the load data Dd, the first reference data Da1, and the second reference data Da2 have the same variation due to variation in the constant power supply +Vcc. Because the ratio R is the ratio between the first difference $\Delta D1$ and the second reference $\Delta D2$, the ratio R has no variation due to the variation in the constant power supply +Vcc. Therefore, the accuracy of the output value from the correction circuit 11 can be improved.

The embodiment described above may be modified in various ways.

Figure 6:
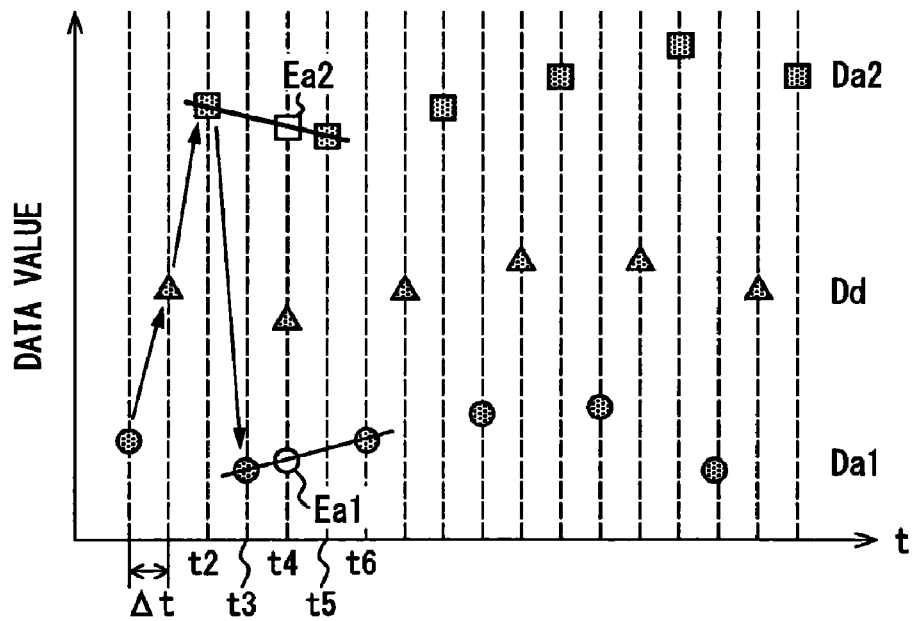
FIG. 6 is a graph illustrating a time when digital data is obtained.

As shown in FIG. 6, in the embodiment, the first reference data Da1, the load data Dd, and the second reference data Da2 are successively obtained in that order at each rising edge of the clock signal PB, i.e., at the regular intervals $\Delta t$. In other words, the first reference signal Sa1, the load signal Sd, and the second reference signal Sa2 are input to the A/D conversion circuit 6 at the regular intervals $\Delta t$.

If values of the first and second reference signals Sa1, Sa2 observed when the load signal Sd is input to the A/D conversion circuit 6 are different from those observed when the first and second reference signals Sa1, Sa2 are actually input to the A/D conversion circuit 6, error due to the difference may be introduced into the rate R and the correction output value Rr.

As shown in FIG. 6, a first estimated reference data Ea1 of the first reference data Da1 at the time (t4) is taken as a linearly interpolated value between previous (t3) and next (t6) values of the first reference data Da1. Likewise, a second estimated reference data Ea2 of the second reference data Da2 at the time (t4) is taken as a linearly interpolated value between previous (t2) and next (t5) values of the second reference data Da2. In this case, the ratio R and the correction value $\Delta R$ are calculated from the load data Dd, the first estimated reference data Ea1, and the second estimated reference data Ea2. Alternatively, the ratio R and the correction value $\Delta R$ may be calculated from an estimated load data of the load data Dd, the first reference data Da1, and the second estimated reference data Ea2, or from the estimated load data of the load data Dd, the first estimated reference data Ea1, and the second reference data Da2. In such an approach, the error due to the difference can be reduced so that the accurate of the output value can be more improved.

The select signal PC may switch at two or more intervals $\Delta t$.

A high-input-impedance differential amplifier circuit having an operational amplifier and a resistor, or an impedance conversion circuit such a voltage follower circuit or a source follower circuit may be connected between the analog MPX 4 and the A/D conversion circuit 6.

The load sensing bridge circuit 1 may be constructed with, for example, a hall element or a magnetoresistive (MR) element. In short, the load sensing bridge circuit 1 may detect a physical quantity such as acceleration, magnetic flux, or humidity. The A/D conversion circuit 6 may find a wide application in converting analog signal to digital signal.

In the correction map shown in FIG. 5, the first reference data Da1 may be used instead of the second reference data Da2.

The RGD 7 may have a circuit configuration different from that shown in FIG. 1. Such changes and modifications are to be understood as being within the scope of the present invention as defined by the appended claims.

What is claimed is:

1. An analog-to-digital conversion apparatus, comprising:
a reference voltage generation circuit for generating a first reference signal having a first constant voltage level and a second reference signal having a second constant voltage level different from the first constant voltage level;
an analog-to-digital conversion circuit including a ring-gate-delay circuit having a plurality of inverting circuits that perform an inverting operation at a variable speed depending on a power voltage of the ring-gate-delay circuit and are connected in a ring pattern, the analog-to-digital conversion circuit converting a physical quantity signal having a voltage level varying with an amount of a physical quantity, the first reference signal, and the second reference signal, each signal being provided to the ring-gate-delay circuit as the power voltage, to a physical quantity data, a first reference data, and a second reference data, respectively, based on the number of times a pulse signal input to the ring-gate-delay circuit circulates through the ring-gate-delay circuit; and
a signal processing means for calculating an output value corresponding to the physical quantity based on a ratio between a first deference and a second difference, wherein
the first difference is a difference between any single pair from the physical quantity data, the first reference data, and the second reference data, and
the second difference is a difference between one of other pairs from the physical quantity data, the first reference data, and the second reference data.

2. The analog-to-digital conversion apparatus according to claim 1, wherein
one of the first and second differences is a difference between the first reference data and the second reference data.

3. A sensing apparatus, comprising:
a sensing circuit for generating a physical quantity signal having a voltage level varying with an amount of a physical quantity to be measured;
a reference voltage generation circuit for generating a first reference signal having a first constant voltage level and a second reference signal having a second constant voltage level different from the first constant voltage level;
an analog-to-digital conversion circuit including a ring-gate-delay circuit having a plurality of inverting circuits that perform an inverting operation at a variable speed depending on a power voltage of the ring-gate-delay circuit and are connected in a ring pattern, the analog-to-digital conversion circuit converting the physical quantity signal, the first reference signal, and the second reference signal, each signal being provided to the ring-gate-delay circuit as the power voltage, to a physical quantity data, a first reference data, and a second reference data, respectively, based on the number of times a pulse signal input to the ring-gate-delay circuit circulates through the ring-gate-delay circuit;
a signal processing means for calculating an output value corresponding to the physical quantity based on a ratio between a first deference and a second difference; and
a storing means for storing a relation between a correction value for correcting a temperature dependence of the ratio on the sensing circuit and the first reference data or the second reference data, wherein
the first difference is a difference between any single pair from the physical quantity data, the first reference data, and the second reference data,
the second difference is a difference between one of other pairs from the physical quantity data, the first reference data, and the second reference data, and
the signal processing means calculates the correction value of the ratio from the first reference data or the second reference data by using the relation stored by the storing means, corrects the ratio based on the correction value, and calculates the output value based on the corrected ratio.

4. The sensing apparatus according to claim 3, wherein
the reference voltage generation circuit includes at least two resistors across which a power source voltage is applied, and generates the first and second reference signals by dividing the power source voltage by a ratio between resistances of the resistors.

5. The sensing apparatus according to claim 3, further comprising:
an analog multiplexer for repeatedly outputting the physical quantity signal, the first reference signal, and the second reference signal to the analog-to-digital conversion circuit in a predetermined order.

6. A sensing apparatus, comprising:
a sensing circuit for generating a physical quantity signal having a voltage level varying with an amount of a physical quantity to be measured;
a reference voltage generation circuit for generating a first reference signal having a first constant voltage level and a second reference signal having a second constant voltage level different from the first constant voltage level;
an analog-to-digital conversion circuit including a ring-gate-delay circuit having a plurality of inverting circuits that perform an inverting operation at a variable speed depending on a power voltage of the ring-gate-delay circuit and are connected in a ring pattern, the analog-to-digital conversion circuit converting the physical quantity signal, the first reference signal, and the second reference signal, each signal being provided to the ring-gate-delay circuit as the power voltage, to a physical quantity data, a first reference data, and a second reference data, respectively, based on the number of times a pulse signal input to the ring-gate-delay circuit circulates through the ring-gate-delay circuit;
a signal processing means for calculating an output value corresponding to the physical quantity based on a ratio between a first deference and a second difference; and
an analog multiplexer for repeatedly outputting the physical quantity signal, the first reference signal, and the second reference signal to the analog-to-digital conversion circuit in a predetermined order, wherein
the signal processing means calculates the ratio by using one actual data of the physical quantity data, the first reference data, and the second reference data, and two estimated data of others of the physical quantity data, the first reference data, and the second reference data, each of the two estimated data is estimated from a previous data corresponding to a previous signal that is input to the analog-to-digital conversion circuit just before a signal converted to the actual data is input thereto and a next data corresponding to a next signal that is input to the analog-to-digital conversion circuit just after the signal converted to the actual data is input thereto, the first difference is a difference between any single pair from the one actual data and the two estimated data, and the second difference is a difference between one of other pairs from the one actual data and the two estimated data.

7. A sensing apparatus according to claim 6, wherein the each of the two estimated data is estimated as an average of the previous data and the next data.

* * * * *